(12) United States Patent
Bai et al.

(10) Patent No.: US 7,473,652 B2
(45) Date of Patent: Jan. 6, 2009

(54) ORGANIC POLYMERS, ELECTRONIC DEVICES, AND METHODS

(75) Inventors: Feng Bai, Woodbury, MN (US); Todd D. Jones, St Paul, MN (US); Kevin M. Lewandowski, Inver Grove Heights, MN (US); Tzu-Chen Lee, Woodbury, MN (US); Dawn V. Muyres, St. Paul, MN (US); Tommie W. Kelley, Coon Rapids, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 377 days.

(21) Appl. No.: 11/428,084

(22) Filed: Jun. 30, 2006

(65) Prior Publication Data

US 2006/0237717 A1 Oct. 26, 2006

Related U.S. Application Data

(62) Division of application No. 10/434,377, filed on May 8, 2003, now Pat. No. 7,098,525.

(51) Int. Cl.
*H01L 21/31* (2006.01)
*H01L 21/469* (2006.01)

(52) U.S. Cl. .......................... 438/780; 257/40; 257/632; 257/643; 257/532; 257/535; 257/310; 257/311; 257/410; 438/396; 438/99; 438/623

(58) Field of Classification Search ........... 257/40, 257/632, 642, 643, 532, 535, 310, 311, 410; 438/396, 99, 623, 780
See application file for complete search history.

(56) References Cited

U.S. PATENT DOCUMENTS 4,034,014 A 7/1977 Curtis, Jr. et al.

(Continued)

FOREIGN PATENT DOCUMENTS

EP 0 298 628 1/1989

(Continued)

OTHER PUBLICATIONS

Bedekar, B. A. et al., "Dielectric Relaxation of Cyanoethylated Poly(2,3-dihydroxypropyl methacrylate)", *Polymer*, (1995), pp. 4735-4740, vol. 36, No. 25, Elsevier Science Ltd.

(Continued)

*Primary Examiner*—Matthew Smith
*Assistant Examiner*—Jarrett J Stark
(74) *Attorney, Agent, or Firm*—Kent S. Kokko

(57) ABSTRACT

Organic polymers for use in electronic devices, wherein the polymer includes repeat units of the formula:

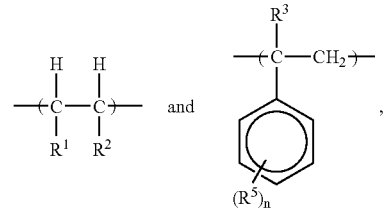

wherein: each $R^1$ is independently H, an aryl group, Cl, Br, I, or an organic group that includes a crosslinkable group; each $R^2$ is independently H, an aryl group or $R^4$; each $R^3$ is independently H or methyl; each $R^5$ is independently an alkyl group, a halogen, or $R^4$; each $R^4$ is independently an organic group that includes at least one CN group and has a molecular weight of about 30 to about 200 per CN group; and n=0-3; with the proviso that at least one repeat unit in the polymer includes an $R^4$. These polymers are useful in electronic devices such as organic thin film transistors.

22 Claims, 3 Drawing Sheets

U.S. PATENT DOCUMENTS

| | | | |
|---|---|---|---|
| 4,066,925 | A | 1/1978 | Dickson et al. |
| 4,322,524 | A | 3/1982 | Onda et al. |
| 4,335,180 | A | 6/1982 | Traut |
| 4,554,324 | A | 11/1985 | Husman et al. |
| 5,085,886 | A | 2/1992 | Zupancic et al. |
| 5,126,915 | A | 6/1992 | Pepin et al. |
| 5,347,144 | A | 9/1994 | Garnier et al. |
| 5,358,775 | A | 10/1994 | Horn, III |
| 5,408,023 | A | 4/1995 | Priddy et al. |
| 5,593,782 | A | 1/1997 | Budd |
| 5,654,126 | A | 8/1997 | Kukanskis et al. |
| 5,739,193 | A | 4/1998 | Walpita et al. |
| 5,844,168 | A | 12/1998 | Schueller et al. |
| 5,844,362 | A | 12/1998 | Tanabe et al. |
| 5,908,698 | A | 6/1999 | Budd |
| 6,099,939 | A | 8/2000 | Mittal et al. |
| 6,129,986 | A | 10/2000 | Bessho et al. |
| 6,142,643 | A | 11/2000 | Araki et al. |
| 6,159,611 | A | 12/2000 | Lee et al. |
| 6,184,325 | B1 | 2/2001 | Plochocka |
| 6,265,243 | B1 | 7/2001 | Katz et al. |
| 6,274,224 | B1 | 8/2001 | O'Bryan et al. |
| 6,433,359 | B1 | 8/2002 | Kelley et al. |
| 6,586,791 | B1 | 7/2003 | Lee et al. |
| 6,617,609 | B2 | 9/2003 | Kelley et al. |
| 6,864,396 | B2 | 3/2005 | Smith et al. |
| 6,897,164 | B2 | 5/2005 | Baude et al. |
| 6,946,676 | B2 | 9/2005 | Kelley et al. |
| 6,974,877 | B2 | 12/2005 | Vogel et al. |
| 2002/0045289 | A1 | 4/2002 | Dimitrakopoulos et al. |
| 2002/0053320 | A1 | 5/2002 | Duthaler et al. |
| 2003/0097010 | A1 | 5/2003 | Vogel et al. |
| 2003/0100779 | A1 | 5/2003 | Vogel et al. |
| 2003/0102471 | A1 | 6/2003 | Kelley et al. |
| 2003/0102472 | A1 | 6/2003 | Kelley et al. |
| 2003/0150384 | A1 | 8/2003 | Baude et al. |
| 2003/0151118 | A1 | 8/2003 | Baude et al. |
| 2006/0057857 | A1 | 3/2006 | Fleming et al. |

FOREIGN PATENT DOCUMENTS

| | | |
|---|---|---|
| EP | 0 674 325 | 9/1995 |
| EP | 0 902 048 | 3/1999 |
| WO | WO 92/11580 | 7/1992 |
| WO | WO 97/15173 | 4/1997 |
| WO | WO 98/20394 | 5/1998 |
| WO | WO 01/89827 | 11/2001 |

OTHER PUBLICATIONS

Bhattacharya, S.K., et al., "MCM-L Composite Integrated Resistors and Capacitors", *Proc: Int. Symp. Adv. Packag. Mater.: Processes, Prop. Interfaces*, 4th, pp. 295-299 (1998).

Bhattacharya, S.K., et al., "Next Generation Integral Passives: materials, processes, and integration of resistors and capacitors on PWB substrates", *J. Mater. Sci. Mater. In Electroncis*, vol. 11, pp. 253-268 (2000).

Calvert and Pitts, Ed., "Ch. 11—the Interaction of Light with Atoms; Atom-Photosensitized Reactions", "Photochemistry", John Wiley & Sons, Title page, Publication Page, Table of Contents and pp. 27-126 (1996).

Chahal, P., et al., "A Novel Integrated Decoupling Capacitor for MCM-L Technology", *IEEE Trans. Compon. Packag. Manuf. Technol.*, vol. 21, pp. 184-193 (1999).

Cho., S.D., et al., "Study on the Epoxy/BaTiO$_3$ Embedded Capacitor Films Newly Developed for PWB Applications", *IEEE Proceedings of the 52$^{nd}$ Electronic Components and Technology Conference*, pp. 504-509 (2002).

Dimitrakopoulos, C.D., et al., "Low-Voltage Organic Transistors on Plastic Comprising High-Dielectric Constant Gate Insulators", *Science*, vol. 283, Title Page, Publication and Table of Contents, pp. 822-824 (1999).

Garnier, Francis, et al., "An All-Organic 'Soft' Thin Film Transistor with Very High Carrier Mobility", *Advanced Materials*, VCH Verglagsgesellschaft, Weinheim, DE, vol. 2, No. 12, Dec. 1990, pp. 592-594.

Gregor, L.V.., "Polymer Dielectric Films", *IBM Journal of Research and Development USA*, vol. 12, No. 2, Mar. 1968 pp. 140-162.

Gundlach, David, J., et al., "Improved Organic Thin Film Transistor Performance Using Chemically-Modified Gate Dielectrics", *Proceedings of SPIE*, vol. 4466 (2001) copyright 2001 SPIE.

Horie, K., et al., *Photosensitive Polymidies: Fundamentals and Applications, Technomic Publishing Company Inc.*, Lancaster PA, Title Page, Publication page and Table of Contents (7 pp. total) (1995).

Jackson, T.N., "Pentacene organic thin film transistors for large area electronics applications", Organic Field Effect Transistors-Conferences-SPIE Annual Meeting-Program-Conferences-SPIE Web, presented at the International Symposium on Optical Science and Technology, SPIE's 47$^{th}$ Annual Meeting, San Diego, California Jul. 29-Aug. 3 (2001). Conference schedule available online at http://spie.org/Conferences/Programs/01/am/confs/4466.html (Oct. 22, 2003) (4 pages).

Jayasundere, J., et al., "Dielectric Constant for Binary Piezoelectric 0-3 Composites" *Journal of Applied Physics*, vol. 73, pp. 2462-2466 (1993).

Klauk, H. et al., "High-mobility Polymer Gate Dielectric Pentacene Thin Film Transistors", *J. Applied Physics*, vol. 92, No. 9, Title Page, Publication page, Table of Contents, and pp. 5259-5263, (2002).

Ohara, et al., "Barium Titanate Fabricated From Fur-Fibres", *J. Mater. Sci. Mater. In Electroncis*, vol. 7, pp. 27-33 (1996).

Peng, X., et al., "All-Organic Thin Film Transistors Made of Alpha-sexithienyl Semiconducting and Various Polymeric Insulating Layers", *Applied Physics Letters*, vol. 57, No. 19, pp. 2013-2015 (Nov. 5, 1990).

Popielarz, R., et al., "Preparation and Characterization of Photopatternable BaTiO3/Polymer Composites", *Materials Research Society Symposium-Proceedings* 628 (Organic/Inorganic Hybrid Materials-2000) Title Page, Publication Page, Table of Contents and pp. CC11. 51-CC11.5.6 (2001).

Rao, Y. et al., "High K Polymer-cermanic Nano-composite Development, Characterization, and Modeling for Embedding Capacitor RF Application", *IEEE Proceedings of the 51$^{st}$ Electronic Components and Technology Conference*, pp. 1408-1412 (2001).

Rao, Y., et al., "Ultra High Dielectric Constant Epoxy Silver Composite for Embedded Capacitor Application", *IEEE Proceedings of the 52$^{nd}$ Electronic Components and Technology Conference*, pp. 920-9923 (2002).

Schuller et al., "N,N-Bis(2-cyanoethyl)acrylamid" *The Journal of Organic Chemistry*. vol. 23, Title Page and pp. 1047-1049 (Jan.-Jun. 1958).

Shaw, J.M., et al., "Organic Electronics: Introduction ", *IBM J. Res. & Dev.*, vol. 45 No., Title page, Publication page, Table of Contents, and pp. 3-9 (2001).

Sheraw, C. D., et al., "Spin-on polymer gate dielectric for high performance organic thin film transistors", *Materials Research Society Symposium Proceedings v 558, Materials Research Society*, Warrendale, PA, USA, pp. 403-408 (2000).

Ullmann, A, et al., "High Performance Organic Field-Effect Transistors and Integrated Inverters", *Materials Research Society Symposium—Proceedings* vol. 665, pp. C7.5.1-C7.5.6. (2001).

ORGANIC POLYMERS, ELECTRONIC DEVICES, AND METHODS

This application is a divisional application of U.S. Ser. No. 10/434,377, filed May 8, 2003, now U.S. Pat. No. 7,098,525.

BACKGROUND

Organic polymeric materials, such as organic dielectrics, are used in a wide variety of electronic devices, including optoelectronic devices. Examples include transistors, diodes, capacitors (e.g., embedded capacitors), resistors, which can be used in various arrays to form amplifiers, receivers, transmitters, inverters, and oscillators, for example.

Organic semiconductors, such as tetracene, pentacene, and sexithiophene, are currently of great interest for a variety of electronic applications as well. One of the key benefits to using organic semiconductors, versus standard silicon-based materials, is the potential to use solution deposition techniques. However, in order for this benefit to be fully realized, all components of the device should be deposited from solution, including the dielectric layer.

Furthermore, in order to obtain useful devices (e.g., transistors), it is important to have a reasonable charge carrier mobility within the device, preferably greater than $1.0$ $cm^2/V \cdot s$. Historically, organic polymer dielectrics have produced devices with low mobilities. However, an advantage of using organic polymer dielectrics is that they are solution processible and photopatternable. Thin layers of organic polymers have been shown to improve mobilities in devices prepared on inorganic oxides, such as $Al_2O_3$ or $SiO_2$, which have dielectric constants that are higher than most organic polymers.

A number of organic polymers have been considered as dielectric materials. These include polyimides, parylene C, crosslinked benzocyclobutene, and cyanoethylpullulan. See, for example, C. D. Sheraw et al., "Spin-on polymer gate dielectric for high performance organic thin film transistors", Materials Research Society Symposium Proceedings v 558, Materials Research Society, Warrendale, Pa., USA, pages 403-408 (2000); U.S. Pat. No. 6,265,243 (Katz); and U.S. Pat. No. 5,347,144 (Garnier). Mobilities measured in devices prepared using these polymers, however, are typically no higher than $0.7$ $cm^2/V \cdot s$.

In addition, a high dielectric constant is desirable to permit the use of relatively thick films, which have a relatively lower probability of pinhole defects than thin films. Also, a high dielectric constant is desirable to lower the operating voltages of devices while maintaining the same charge polarization.

Thus, organic polymers are desired for a variety of electronic devices (e.g., transistors, capacitors, etc.). Particularly, organic polymers are desired that combine relatively high observed device mobilities with relatively high dielectric constants and that are preferably capable of being solution-deposited, e.g., by spin-coating or similar techniques.

SUMMARY

The present invention is directed to polymers suitable for use in electronic devices. More particularly, the present invention provides cyano-functional (preferably, cyano-functional styrenic) polymers, preferably with relatively high dielectric constants. These polymers can be prepared by standard chemical techniques (e.g., free radical polymerization from the corresponding monomers or chemical modifications of existing polymers), and used as a dielectric layer in electronic devices, in some cases without the addition of a surface-modifying film.

Suitable polymers for use in devices preferably include a cyano-functional portion and a portion that provides a relatively high dielectric constant to the overall polymer, which portions may be the same or different. The polymers can be homopolymers or copolymers. Copolymers are those polymers prepared from two or more different monomers and include terpolymers, tetrapolymers, and the like. The monomers can join to form random, block, segmented copolymers, as well as any of a variety of other structural arrangements.

In one embodiment, the present invention provides an electronic device that includes an organic polymer dielectric layer. The dielectric layer includes a substantially nonfluorinated organic polymer having repeat units of the formulas:

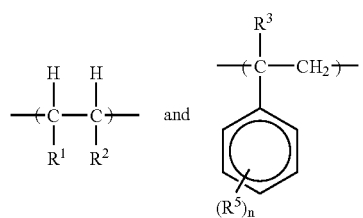

wherein: each $R^1$ is independently H, an aryl group (including aralkyl and alkaryl), Cl, Br, I, or an organic group that includes a crosslinkable group (i.e., one or more crosslinkable groups); each $R^2$ is independently H, an aryl group (including aralkyl and alkaryl), or $R^4$; each $R^3$ is independently H or methyl; each $R^5$ is a substituent on the aromatic ring and is independently an alkyl group, a halogen, or $R^4$; n=0-3; and each $R^4$ is independently an organic group that includes at least one CN group and has a molecular weight of about 30 to about 200 per CN group; with the proviso that at least one repeat unit in the polymer includes an $R^4$. Preferably, at least one $R^1$ includes a crosslinkable group. The two repeat units could be the same, thereby forming a homopolymer. For certain embodiments, the substantially nonfluorinated dielectric polymer is crosslinked.

In another embodiment, the present invention provides an electronic device that includes a photopatternable organic polymer dielectric layer that includes an organic polymer (preferably, a substantially nonfluorinated organic polymer) having repeat units of the formulas:

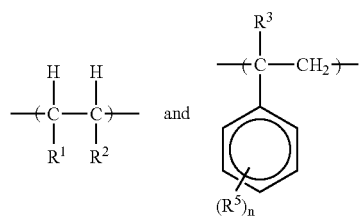

wherein: each $R^1$ is independently an organic group that includes a crosslinkable group (i.e., one or more crosslinkable groups); each $R^2$ is independently H, an aryl group (including alkaryl and aralkyl), or $R^4$; each $R^3$ is independently H or methyl; each $R^5$ is a substituent on the aromatic ring and is independently an alkyl group, a halogen, or $R^4$; n=0-3; and each $R^4$ is independently an organic group that includes at least one CN group and has a molecular weight of about 30 to about 200 per CN group; with the proviso that at least one repeat unit in the polymer includes an $R^4$. The two repeat units could be the same, thereby forming a homopolymer. For certain embodiments, the organic polymer is crosslinked upon photopatterning.

Specific embodiments of devices, methods, and preferred polymers are also provided.

For example, specifically preferred devices include capacitors (e.g., embedded capacitors), thin film transistors or transistor arrays, and electroluminescent lamps. The devices preferably include an organic polymer dielectric layer with styrenic units (preferably, cyano-functional styrenic units) at its surface.

A wide variety of electronic devices can be made by forming a layer (i.e., a film) of an organic polymer described herein, optionally annealing the organic polymer, and optionally crosslinking the organic polymer.

A particularly preferred method of making an electronic device includes: forming a layer of an organic polymer having a dielectric constant of at least about 3.5, wherein the organic polymer includes cyano-functional groups and styrenic units (which may include the cyano-functional groups); annealing the organic polymer to cause the styrenic units to migrate to the surface of the layer; and optionally crosslinking the organic polymer to form an organic polymer dielectric layer. The present invention also provides an electronic device prepared by this method.

As used herein, a "polymer" includes two or more repeat units (e.g., homopolymers and copolymers), and a "copolymer" includes two or more different repeat units, and encompasses terpolymers, tetrapolymers, etc. The copolymers can be random, block, alternating, etc.

As used herein, "a" or "an" or "the" are used interchangeably with "at least one" to mean "one or more" of the element being modified.

As used herein, the term "organic group" means a hydrocarbon group (with optional elements other than carbon and hydrogen, such as oxygen, nitrogen, sulfur, silicon, and halogens) that is classified as an aliphatic group, cyclic group, or combination of aliphatic and cyclic groups (e.g., alkaryl and aralkyl groups). In the context of the present invention, the organic groups are those that do not interfere with the film-forming properties of the organic dielectric layer and/or the formation or function of a semiconductor layer adjacent to the organic dielectric layer. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, hexyl, heptyl, dodecyl, octadecyl, amyl, 2-ethylhexyl, and the like. The term 'alkenyl group' means an unsaturated linear or branched hydrocarbon group with one or more carbon-carbon double bonds, such as a vinyl group. The term "alkynyl group" means an unsaturated linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group, including within its scope alkaryl and aralkyl groups. The term "heterocyclic group" means a closed ring hydrocarbon in which one or more of the atoms in the ring is an element other than carbon (e.g., nitrogen, oxygen, sulfur, etc.).

Substitution is anticipated on the organic groups of the polymers of the present invention. As a means of simplifying the discussion and recitation of certain terminology used throughout this application, the terms "group" and "moiety" are used to differentiate between chemical species that allow for substitution or that may be substituted and those that do not allow or may not be so substituted. Thus, when the term "group" is used to describe a chemical substituent, the described chemical material includes the unsubstituted group and that group with O, N, Si, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

As used herein, "layer" refers to any layer that can be formed on a substrate from precursor compounds using a solution coating process or vapor deposition process, for example. The term "layer" is meant to include layers specific to the semiconductor industry, such as "barrier layer," "dielectric layer," "insulating layer," and "conductive layer." (The term "layer" is synonymous with the term "film" frequently used in the semiconductor industry.) The term "layer" is also meant to include layers found in technology outside of semiconductor technology, such as coatings on glass. "Dielectric layer" as used herein refers to a layer (or film) having a relatively high dielectric constant containing cyano-functional polymers, preferably styrenic polymers.

Other features and advantages of the invention will be apparent from the following detailed description of the invention and the claims. The above summary of principles of the disclosure is not intended to describe each illustrated embodiment or every implementation of the present disclosure. The detailed description that follows more particularly exemplifies certain preferred embodiments utilizing the principles disclosed herein.

DETAILED DESCRIPTION OF ILLUSTRATIVE EMBODIMENTS

Figure 1:
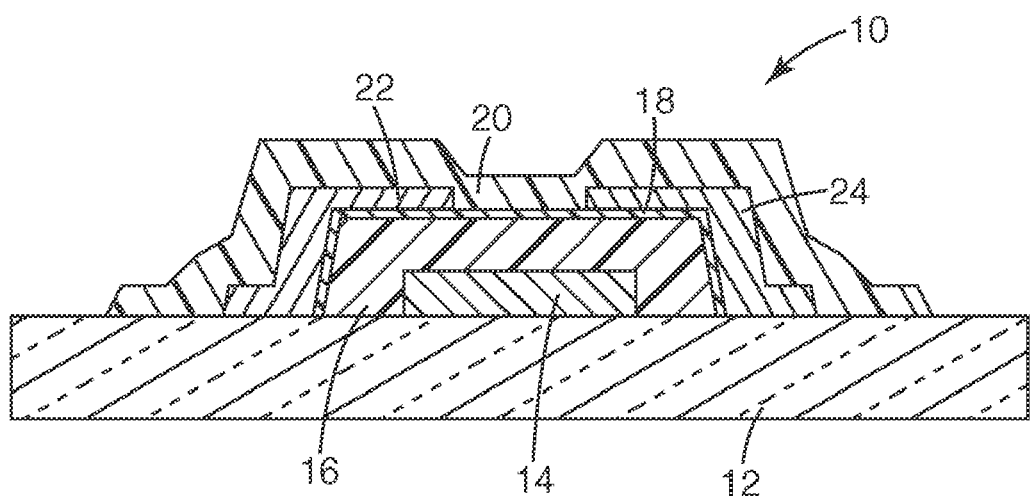
FIG. 1 is a schematic of an organic thin film transistor.

The present invention is directed to polymers suitable for use in electronic devices, including optoelectronic devices. More particularly, the present invention provides cyano-functional polymers with relatively high dielectric constants (preferably, at least about 3.5, more preferably at least about 4.0, and even more preferably at least about 4.5). In certain preferred embodiments, the polymers include cyano-functional groups and styrenic units. The styrenic units may include the cyano-functional groups and/or the cyano-functional groups may be part of other inter-polymerized units.

The polymers described herein can be prepared by standard chemical techniques (e.g., free radical polymerization from the corresponding monomers or chemical modifications of existing polymers), and used as a dielectric layer in electronic devices (e.g., field-effect thin film transistors, capacitors, embedded capacitors or electroluminescent lamps) or as a dielectric layer in devices used as components of an integrated circuit (e.g., inverters or oscillators). Various combinations (e.g., mixtures) of the cyano-functional polymers described herein (with or without other organic polymers) can be used in devices of the present invention.

Electronic devices include components such as transistors, arrays of transistors, diodes, capacitors, embedded capacitors, and resistors that are used to form circuits. Electronic devices also include arrays of circuits that perform an electronic function. Examples of these arrays, or integrated circuits, are amplifiers, receivers, transmitters, inverters, and oscillators.

Applications of these devices and arrays include radio frequency identification devices (RFIDs), smart cards, lamps, displays, and the like. Devices of the present invention may also include camera flash capacitors, energy storage capacitors, etc. The present invention is not limited by the type of device.

Particularly preferred types of devices include thin film transistors, capacitors, embedded capacitors and electroluminescent lamps. In a thin film transistor (TFT), the polymer layer of the present invention would typically be interposed between a conductive gate electrode layer and a semiconductor layer, or alternatively between a conductive gate electrode layer and a second conductive source/drain layer. In a capacitor, the polymeric layer of the present invention would typically be interposed between two conductive layers.

An embedded capacitor is a capacitor that is embedded or integrated as a component of a circuit, preferably a flexible circuit. In this type of device, the polymeric layer of the present invention would be sandwiched between two flexible, conductive substrates, such as copper foil. An electroluminescent lamp (EL) is an electronic device that produces light when current is passed through it. In such a device the polymeric layer of the present invention would be interposed between a light emitting layer and one or both of the electrodes.

Transistors, such as pentacene-based transistors, fabricated using the materials of the present invention, preferably possess a charge carrier mobility of greater than about 0.5 $cm^2/V \cdot s$, more preferably greater than about 1.5 $cm^2/V \cdot s$, and even more preferably greater than about 3.0 $cm^2/V \cdot s$. These transistors preferably have relevant device parameters within acceptable ranges (e.g., threshold voltage between +15 Volts (v) and −15 V, on/off ratio of at least $10^3$, and subthreshold slope less than about 2.5V/decade).

In addition, materials of the present invention are also generally useful with other types of organic semiconductors including oligothiophenes, acenes, perylenes, fullerenes, phthalocyanines, etc. The materials of the present invention are also generally useful with inorganic semiconductors such as, for example, amorphous Si, CdS, CdSe, and other semiconductors well known in the art.

The organic polymeric dielectrics can also be useful in fabricating organic thin film transistors using polymeric semiconductors such as, but not limited to, those discussed in Assignee's U.S. Pat. Nos. 6,974,877 and 6,864,396.

Certain embodiments of capacitors fabricated using the materials of the present invention preferably exhibit high breakdown voltages (e.g., greater than 50V for 2000 Angstrom (Å) layer thickness) and/or relatively constant dielectric loss as a function of frequency.

In certain embodiments, relatively high dielectric constant polymers of the present invention possess one or more of the following characteristics: coatable out of solution, crosslinkable, photopatternable, high thermal stability (e.g., are stable up to a temperature of about 250° C.), low processing temperatures (e.g., less than about 150° C., preferably less than about 100° C.), and are compatible with flexible substrates.

Crosslinkable and/or photopatternable polymers are particularly desirable. This is because they provide flexibility in manufacturing methods, would easily integrate with solution processed device layers, and could allow for high-speed roll-to-roll processing. Polymers are photopatternable if they include one or more crosslinking (i.e., crosslinkable) groups that can be induced to form a crosslinked network upon exposure to radiation (most commonly, UV radiation). The exposed (crosslinked portion of the polymer) becomes insoluble in certain solvents and the unexposed portion of the polymer can be washed away using a developing solvent. This is an example of a negative-acting photopatternable polymer. It is also possible to photopattern a polymer that is initially insoluble in certain solvents and that becomes soluble in UV-exposed areas upon exposure. This is an example of a positive-acting photopatternable polymer.

Photopatterning can be carried out by a variety of techniques well known to those of skill in the art. Typically, photopatterning is carried out with ultraviolet light and a photomask. Photopatterning is further described in International Application No. WO 97/15173, published Apr. 24, 1997. It may also be desirable to coat the photopatternable polymer evenly over the entire surface of the device using no mask and no pattern. The polymer layer can then be crosslinked as described above, with or without forming a pattern.

The polymers of the present invention are preferably deposited using solution coating techniques. Examples of such techniques include knife coating, spin coating, drop coating, dip coating, ink jetting, rotogravure coating, spray coating, and roll coating. Solvents suitable for use with the polymers of the present invention for solution coating include any solvent or solvent mixture that will dissolve the polymers to form a low viscosity solution suitable for coating by any of the above methods. Examples of useful solvents include hydrocarbons, chlorinated solvents, and ketonic solvents. More particularly useful are solvents such as cyclohexanone, cyclopentanone, dichloroethane, dimethylformamide, toluene, and chloroform. In addition, the polymers of the present invention can be transfer printed.

For TFTs, the polymeric dielectric layer of the invention has a thickness of less than about 5000 Angstroms (Å), more preferably less than about 3000 Å, and most preferably less than about 2000 Å. The polymeric dielectric layer of the invention preferably has a thickness of at least about 500 Å, more preferably at least about 1000 Å. The thickness can be determined through known methods, e.g., ellipsometry and profilometry. For embedded capacitors, and printed circuit board applications, thicknesses can include those described above for TFTs, but may further include thicknesses of 10 microns, 20 microns (i.e., micrometers or μm), or even greater.

CN-Containing Polymers and Preparation Methods

Polymers of the present invention include cyano-functional groups and styrenic units, which may include the cyano-functional groups. Preferred polymers of the present invention include repeat units of the formula:

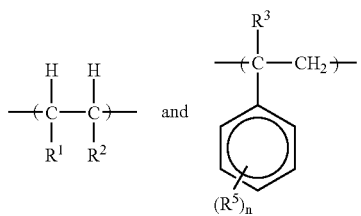

wherein: each $R^1$ is independently H, an aryl group, Cl, Br, I, or an organic group that includes a crosslinkable group (i.e., one or more crosslinkable groups); each $R^2$ is independently H, an aryl group, or $R^4$; each $R^3$ is independently H or methyl; each $R^5$ is a substituent on the aromatic ring and is independently an alkyl group, a halogen, or $R^4$; and n=0-3; and each $R^4$ is an organic group that includes at least one CN group (and for certain embodiments including nitrogen and oxygen atoms) and has a molecular weight of about 30 to about 200 per CN group; with the proviso that at least one repeat unit in the polymer includes an $R^4$. The two repeat units could be the same (e.g., if $R^1$ and $R^3$ are hydrogen and $R^2$ is the same as the phenyl-$(R^5)_n$ group), thereby forming a homopolymer. The polymers of the present invention can include other monomers, e.g., styrene, that can be copolymerized (e.g., ionically, free-radically) with one or more monomers that form the repeat units above.

For certain embodiments, the polymers are crosslinked. Crosslinked polymers typically tolerate higher breakdown field strengths than their uncrosslinked analogs. Also, there is typically a difference in dielectric constants of crosslinked and uncrosslinked polymers.

For certain embodiments, the polymers are substantially nonfluorinated. Herein, "substantially nonfluorinated" means that less than about 5% (more preferably less than about 1% and even more preferably 0%) of the carbons in the polymeric layer have fluorine substituents. Thus, certain polymers can have a small amount of fluorine (e.g., in $R^5$).

For certain embodiments, at least one $R^1$ includes at least one crosslinkable group. Examples of crosslinkable groups include, for example, (meth)acrylates (i.e., acrylates and methacrylates), amines, hydroxyls, thiols, oxiranes, aziridines, chlorosilanes (e.g., trialkoxysilanes), vinyls, and alkoxysilanes (e.g., trialkoxysilanes). Preferably, the crosslinkable groups are acrylates. Combinations of various crosslinkable groups can be within any one polymer. The crosslinkable groups are typically incorporated into an organic group, which can be up to about 20 carbon atoms in size. In addition, the crosslinkable groups can contain heteroatoms such as O, N, S, P, and Si.

For certain embodiments, $R^1$ and $R^2$ include aryl groups that can include up to 18 carbon atoms in size. Preferably, the aryl groups for $R^1$ and $R^2$ are (C5-C8)aryl groups, examples of which include, but are not limited to, phenyl, naphthyl, phenanthryl, anthracenyl, or alkyl-substituted derivatives thereof. Preferred aryl groups for $R^1$ and $R^2$ include phenyl. These groups may be substituted with one to three $R^5$ groups.

For certain embodiments, $R^5$ can be a (C1-C20)alkyl group, more preferably a (C1-C12)alkyl group, even more preferably a (C1-C8)alkyl group, and even more preferably a (C1-C4)alkyl group, examples of which include, but are not limited to, methyl, ethyl, propyl, butyl. For certain other embodiments, $R^5$ can be a halogen, and preferably, Cl, Br, or I. For certain other embodiments, $R^5$ can be $R^4$ wherein $R^4$ is a (C2-C12) organic group having at least one CN group and having a molecular weight of about 30 to about 200 per CN group.

For certain embodiments, each $R^4$ is a (C2-C20) organic group, more preferably a (C2-C12) organic group, including at least one CN group and having a molecular weight of about 30 to about 200 per CN group. For certain embodiments, $R^4$ includes one or more aromatic groups. Preferably, the molecular weight is about 30 to about 150 per CN group. Examples of CN-containing groups for $R^4$ include, but are not limited to, N-methyl-(2-cyanoethyl)carbamido, N-bis(2-cyanoethyl)carbamido, p-(2-cyanoethyl)phenyl, p-(2,2-dicyanopropyl)phenyl, p-(1,2-dicyanopropionitrilo)phenyl, N-methyl-N-(2-cyanoethyl)benzylamino, bis-N-(2-cyanoethyl)benzylamino, cyanomethyl, 2,2'-dicyanopropyl, 1,2,2'-tricyanoethyl, and N,N'-bis(2-cyanoethyl)aminoethyl.

For certain embodiments, $R^2$ is independently H, a (C5-C8)aryl group, or $R^4$ and $R^4$ is a (C2-C20) organic group, more preferably a (C2-C12) organic group, having at least one CN group and having a molecular weight of about 30 to about 200 per CN group.

Preferred polymers include styrenic interpolymerized units. In certain embodiments, such styrenic units (optionally cyano-functional) can migrate to the surface of a film of the polymer, thereby forming a phase-separated polymer. The polymer can then be crosslinked, if desired. Such phase-separated polymers can be used without an overlying surface-modifying layer (discussed below). Such migration of the styrenic units to the surface of a polymer film can occur during an annealing process. Annealing conditions are selected to allow for this migration to occur without deteriorating or damaging the polymer or other materials subjected to the annealing conditions. Such annealing conditions can be determined by one of skill in the art without undue experimentation. Preferably, annealing occurs at a temperature of at least 120° C. and for a time of at least 10 minutes. Preferably, annealing occurs at a temperature of no greater than 160° C. and for a time of no greater than 60 minutes.

In designing the polymers of the present invention, several approaches can be used to obtain polymers with relatively high dielectric constants, while simultaneously maintaining relatively high mobility in the resulting devices. Typically, these polymers can be prepared by standard chemical techniques such as free radical polymerization from the corresponding monomers or chemical modifications of existing polymers. These approaches provide substantially different materials for obtaining these desirable properties.

In one approach, styrene maleic anhydride (SMA) copolymers can be modified as shown in Scheme 1 by adding a methacrylate functional group for crosslinking purposes and by attaching CN-functional groups to increase the dielectric constant (polymer series 1 and 2) compared to unsubstituted poly(styrene) (preferably having a number average molecular weight of about 1000 to about 500,000).

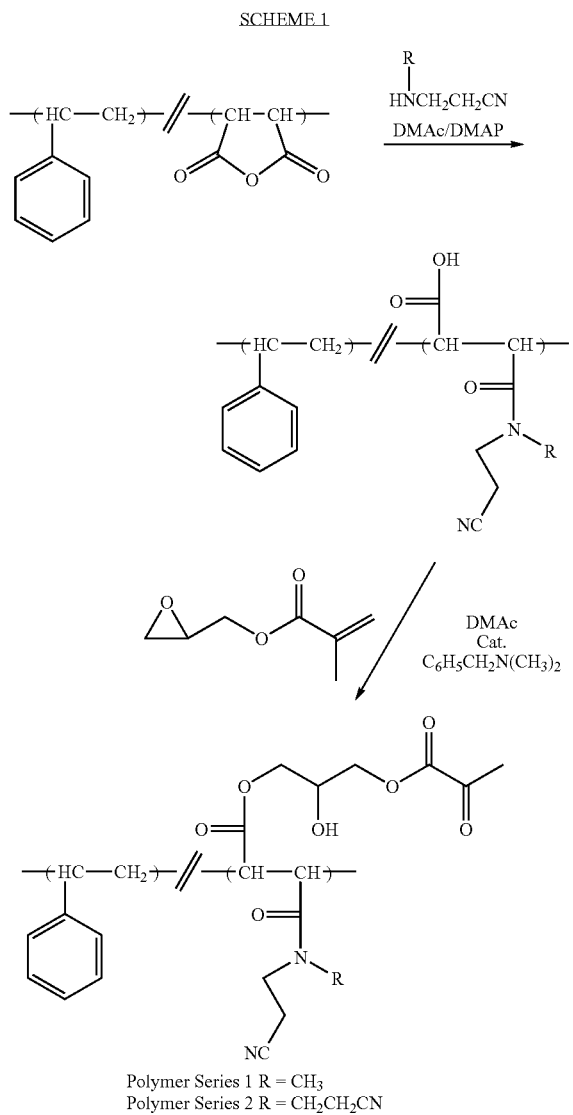

Polymer Series 1 R = CH$_3$
Polymer Series 2 R = CH$_2$CH$_2$CN

Thus the present invention provides a polymer that includes repeat units of the formulas:

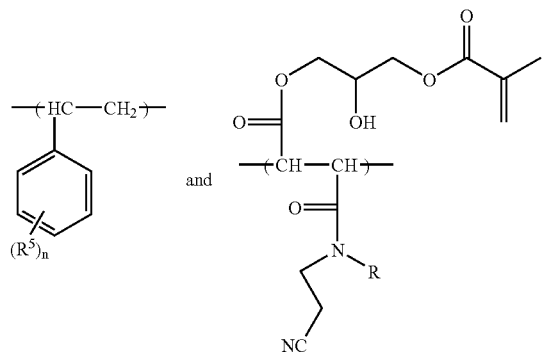

wherein: R is CH$_3$ or CH$_2$CH$_2$CN; each R$^5$ is independently an alkyl group, a halogen, or an organic group comprising at least one CN group and having a molecular weight of about 30 to about 200 per CN group; and n=0-3.

Another approach is based on a polymer with a high dielectric constant, which is unsuitable as a substrate for growing good organic semiconductor films. For example, many ester- and amide-containing materials form poor substrates for pentacene growth due to factors such as surface energy, roughness and/or exposed functional or chemical groups including, for example, polyimide, polymethyl methacrylate (PMMA), and polyvinyl acetate. However, incorporation of a polystyrene block or graft into this polymer, which can migrate to the free surface under annealing prior to organic semiconductor deposition, enables improved device performance without reducing dielectric constant. These can be prepared by sequential polymerization using living polymerization methods, for example, or through copolymerization with functional macromers to form graft copolymers.

A third approach is to prepare polymers that are inherently more suitable for growing organic semiconductor films. By eliminating ester and amide groups, for example, and preparing monomers containing cyano groups for increasing dielectric constant, and aromatic groups for improved semiconductor film growth and frequency independence, a suitable polymer can be directly produced. Subsequently, other groups can be incorporated through copolymerization to provide additional functionality, such as crosslinkability.

A variety of materials can be generated by either of these approaches. An example of a particularly useful polymer is a copolymer of bis(2-cyanoethyl) acrylamide with a polystyrene (PS) macromer (Polymer 3). This polymer is made by copolymerizing an acrylated polystyrene

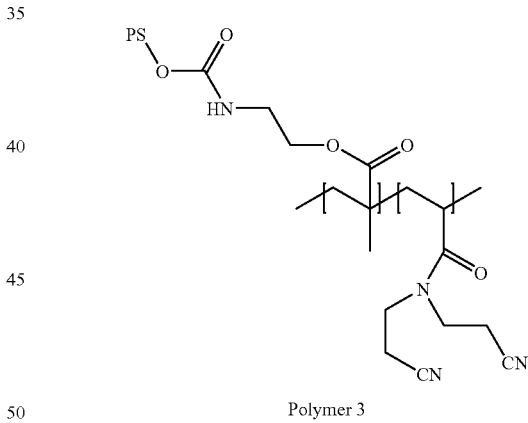

Polymer 3 macromer made by the anionic addition of styrene to n-butyllithium to make a polystyrene with a low polydispersity. The living polymer is then quenched with ethylene oxide and reacted with 2-isocyanatoethyl methacrylate to form an acrylated polystyrene macromer according to the procedure described in U.S. Pat. No. 4,554,424 (Husman). The acrylated polystyrene macromer is then copolymerized with bis (2-cyanoethyl)acrylamide (prepared according to the procedure of Schuller et al., *J. Org. Chem.*, 23, 1047 (1958)).

Examples of other materials that include cyano-functional styrenes, without ester linkages or free hydroxyl groups, are polymers (e.g., copolymers or homopolymers) derived from the polymerization of 4-vinylbenzylcyanide (Polymer 4), 4-(2,2'-dicyanopropyl)styrene (Polymer 5), 4-(1,1',2-tricyanoethyl)styrene (Polymer 6), and/or 4-(bis-cyanoethyl)aminomethyl)styrene (Polymer 7). Other such materials include a copolymer made from copolymerization of 4-vinylbenzyl-cyanide and 4-vinylbenzylacrylate in a 1:1 ratio (Copolymer 8), or other copolymers of such monomers with or without other monomers.

| Polymer 4 | Polymer 5 | Polymer 6 Copolymer 8 | Polymer 7 |
|---|---|---|---|

Suitable polymers for use in electronic devices preferably include a styrenic portion (preferably, a cyano-functional styrenic portion) and a portion that provides a relatively high dielectric constant to the overall polymer, which portions may be the same or different. Thus, the polymers can be homopolymers or copolymers. Copolymers are those polymers prepared from two or more different monomers and include terpolymers, tetrapolymers, and the like. The monomers can join to form random, block, segmented copolymers, as well as any of a variety of other structural arrangements. Preferred polymers are block copolymers with styrenic blocks (preferably, a cyano-functional styrenic block) and blocks having a relatively high dielectric constant.

Copolymers that include a styrenic portion (i.e., styrenic interpolymerized units, and preferably cyano-functional styrenic units) are particularly desirable as these polymers can migrate to the surface of a film of the polymer, thereby forming a phase-separated polymer. Such phase-separated polymers can be used without an overlying surface-modifying layer (discussed below). Such migration of the styrenic units to the surface of a polymer film can occur during an annealing process.

Many other similar structures can also be prepared with different cyano-group connectivity. Synthesis of these materials is detailed in the Examples Section.

If desired the polymers of the present invention can be crosslinked using radiation (e.g., ultraviolet (UV), e-beam, gamma) or thermal energy, for example. Chemical crosslinking agents can also be used if desired. Examples include, but are not limited to, 1,6-hexanediol di(meth)acrylate, 1,4-butanediol di(meth)acrylate, ethylene di(meth)acrylate, glyceryl di(meth)acrylate, glyceryl tri(meth)acrylate, diallyl phthalate, pentaerythritol triacrylate, dipentaerythritol pentaacrylate, neopentyl glycol triacrylate and 1,3,5-tri(2-methacryloxyethyl-s-triazine. Crosslinking can also occur by the addition of small amounts of diepoxides. Alternatively, a polymer with a pendant epoxide functionality could be chemically crosslinked by the addition of diols, triols, etc.

With the use of appropriate reactive diluents it is possible to formulate the polymers of the present invention as 100% solids formulations. Reactive diluents useful in this approach include those mentioned above as crosslinking agents and can also include, but are not limited to, any low viscosity monomer capable of dissolving the polymer and capable of polymerizing with the polymer during the crosslinking reaction. Examples of reactive diluents include ethylenically unsaturated monomers such as acrylic acid and acrylate esters such as methyl methacrylate, ethyl arcylate, 2-ethylhexyl acrylate, and cyclohexyl acrylate.

If desired, the polymers of the present invention can be mixed with a photoinitiator to enhance crosslinking. Useful photoinitiators that initiate free radical polymerization are described, for example, in Chapter II of "Photochemistry" by Calvert and Pitts, John Wiley & Sons (1966). Examples of these photoinitiators include acryloin and derivatives, thereof, such as benzoin, benzoin methyl ether, benzoin ethyl ether, benzoin isopropyl ether, benzoin isobutyl ether, and (alpha)-methylbenzoin; diketones such as benzil and diacetyl, etc.; organic sulfides such as diphenyl monosulfide, diphenyl disulfide, decyl phenyl sulfide, and tetramethylthiuram monosulfide; S-acyl thiocarbamates such as S-benzoyl-N,N-dimethyldithiocarbamate; and phenones such as acetophenone, benzophenone and derivatives.

Other additives can be used with the polymers of the present invention. These include, for example, fillers, diluents (e.g., monoacrylates), rheological thickeners, colorants, surfactants, antioxidants, and the like.

For certain embodiments, the CN-containing polymers of this invention are preferably blended with fillers to form dispersions that become polymer composites when cured. These polymer composites can have a high dielectric constant if the base polymer has a high dielectric constant and if the filler is composed of a material with a high dielectric constant. Dielectrics incorporating superfine ceramic particles have been used to make organic thin film transistors (OTFTs) and are discussed in U.S. Pat. No. 6,586,791. Other useful fillers with high dielectric constants include ferroelectric ceramic fillers such as barium titanate, strontium titanate lead zirconate or many other fillers that have a high dielectric constant such as those disclosed in U.S. Pat. No. 6,159,611 (Lee). It may also be useful to coat the fillers with a coupling agent (e.g., silane coupling agents) in order to make them compatible with the polymer system. Other suitable fillers include metal oxides (e.g., $SiO_2$, $Al_2O_3$, and $TiO_2$), nitrides (e.g., $Si_3N_4$), etc., as well as those disclosed in U.S. Pat. No. 5,126,915 (Pepin et al.), U.S. Pat. No. 5,739,193 (Walpita et al.), and U.S. Pat. No. 5,358,775 (Horn, III). Preferred such filled composites can have a dielectric constant of at least 25, more preferably at least 30, and even more preferably of at least 40.

Thin Film Transistor

As shown in FIG. 1, the present invention provides a thin film transistor (TFT) 10 that includes a substrate 12, a gate electrode 14 disposed on the substrate, a dielectric material 16 of the present invention disposed on the gate electrode, an optional surface-modifying film 18 disposed on the gate dielectric, an semiconductor layer 20 adjacent to the surface-modifying film, and a source electrode 22 and a drain electrode 24 contiguous to the semiconductor layer. FIG. 1 shows one possible thin film transistor configuration. Any other known thin film transistor configuration is possible with the materials of this invention. For example, the source and drain electrodes may be adjacent to the dielectric material with the semiconductor layer over the source and drain electrodes, or the semiconductor layer may be interposed between the source and drain electrodes and the dielectric.

Embedded Capacitor

Figure 2:
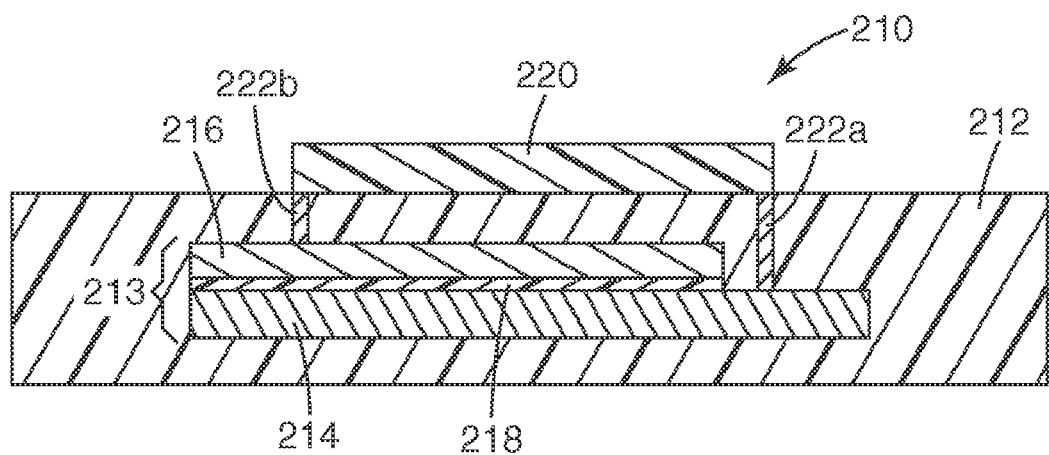
FIG. 2 is a schematic of an embedded capacitor.

As shown in FIG. 2, the present invention provide an embedded capacitor 213 that includes two flexible conductive substrates 214 and 216 with a dielectric material 218 of the present invention interposed between the two flexible substrates. The capacitor 213 is embedded in a material such as a fiberglass/epoxy composite 212. An active electronic device 220 is situated above the embedded capacitor 213 and has electrical connections 222a and 222b to conductive substrates 214 and 216 respectively. Embedded capacitors are used for low impedance power distribution in high speed electronic devices. A further description of embedded capacitors can be found in U.S. Pat. No. 6,274,224 (O'Bryan et al).

Electroluminescent Lamps

Figure 3:
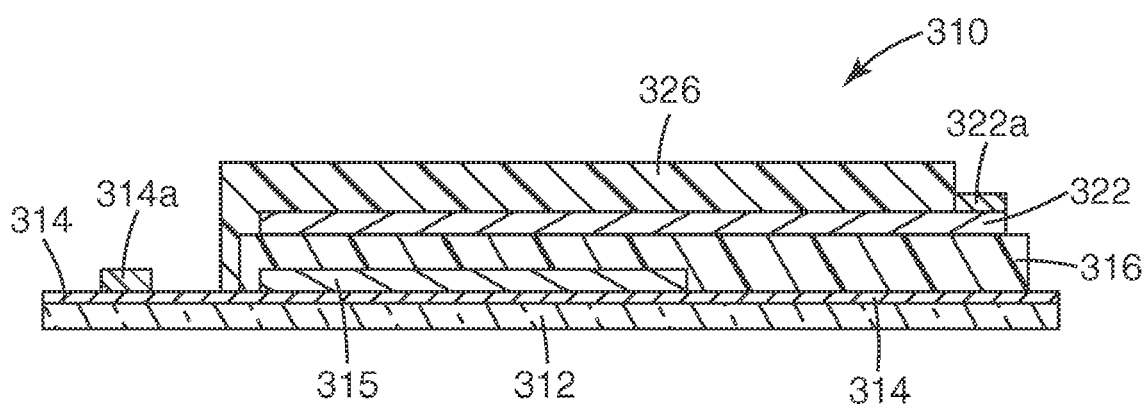
FIG. 3 is a schematic of an electroluminescent lamp.

As shown in FIG. 3, the present invention provides an electroluminescent lamp 310 that includes a transparent conductive film (such as indium-tin-oxide) 314 formed on an upper surface of an insulating transparent film (such as polyethylene terephthalate) 312. A light emitting layer 315 is pattern printed on the transparent conductive film 314 by screen printing, for example. The composition of light-emitting layer 315 is made by dissolving high dielectric resin, such as cyanoethyl pullulan or vinylidene fluoride group rubber in an organic solvent, such as dimethyl formamide or N-methyl pyrrolidinone, and then diffusing an illuminant, such as zinc sulfide, therein. A dielectric material of the present invention 316 is formed on the light emitting layer 315. A back-surface electrode 322 is formed on dielectric layer 316 by using a carbon resin group paste or a silver resin group paste. An insulating coat layer 326 is formed on the back-surface electrode layer 322 by using, for instance, an insulating paste. Electrodes 314a and 322a are formed on conductive layers 314 and 322 respectively as shown. A further description of these devices may be found in, for instance, U.S. Pat. No. 5,844,362 (Tanabe et al).

Surface-Modifying Film

In some embodiments of the present invention, a surface-modifying film (i.e., surface treatment) is used to improve the performance of devices, such as organic thin film transistors, made with the polymer dielectrics of the present invention. For example, such surface treatments can optimally increase the transistor mobility by a factor of 3 or more, making these devices comparable to those made with a standard metal oxide dielectric layer. This increased mobility also allows the electronic devices of the present invention to be used in more complex circuits.

Such surface treatments can take the form of a polymeric surface-modifying film disposed on at least a portion of the dielectric layer. A typical device might further include an organic semiconductor layer, wherein the polymeric surface-modifying film is interposed between the dielectric layer and the organic semiconductor layer.

Examples of suitable materials for surface-modifying films are disclosed in U.S. Pat. No. 6,617,609, which discloses polymers containing interpolymerized siloxane units and U.S. Pat. No. 6,946,676, which discloses polymers containing styrenic interpolymerized units. Examples of other surface-modifying materials include octadecyltrichlorosilane as described in H. Klauk et al., J. Applied Physics, 92(9), 5259-5263. (2002).

For certain embodiments, styrene-containing surface-modifying polymers are used, such as homopolymers of styrene, a-methylstyrene, 4-tert-butylstyrene, 2-methylstyrene, 3-methylstyrene, or 4-methylstyrene; a copolymer of styrene and (trimethoxysilyl)propyl methacrylate; polystyrene with silyl-containing end groups; or copolymers of at least two different monomers selected from styrene, silyl-containing comonomers, α-methylstyrene, 4-tert-butylstyrene, 2-methylstyrene, 3-methylstyrene, and 4-methylstyrene.

The polymeric surface-modifying film of the invention preferably has a thickness of less than about 400 Angstroms (Å), more preferably less than about 200 Å, and most preferably less than about 100 Å. The polymeric surface-modifying film of the invention preferably has a thickness of at least about 5 Å, more preferably at least about 10 Å. The thickness can be determined through known methods, e.g., ellipsometry.

Substrate

A substrate can be used to support a device, e.g., during manufacturing, testing, storage, use, or any combination thereof. Alternatively, the dielectric layer may provide sufficient support for the intended use of the resultant device such that another substrate is not required. In certain embodiments, one substrate may be selected for testing or screening various embodiments while another substrate is selected for commercial embodiments. In other embodiments, a support may be detachably adhered or mechanically affixed to a substrate, such as when the support is desired for a temporary purpose. For example, a flexible polymeric substrate may be adhered to a rigid glass support, which support could be removed. In some embodiments, the substrate does not provide any necessary electrical function for the device. This type of substrate is termed a "non-participating substrate."

Useful substrate materials can include organic and/or inorganic materials. For example, the substrate may include inorganic glasses, ceramic foils, polymeric materials, filled polymeric materials, coated or uncoated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible substrate is used in some embodiments of the present invention. This allows for roll processing, which may be continuous, providing economy of scale and economy of manufacturing over some flat and/or rigid substrates. The flexible substrate chosen preferably is capable of wrapping around the circumference of a cylinder of less than about 50 centimeters (cm) diameter without distorting or breaking. The substrate chosen more preferably is capable of wrapping around the circumference of a cylinder of less than about 25 cm diameter without distorting or breaking the substrate. In some embodiments, the substrate chosen most preferably is capable of wrapping around the circumference of a cylinder of less than about 10 cm diameter, or even about 5 cm diameter, without distorting or breaking the substrate. The force used to wrap the flexible substrate of the invention around a particular cylinder typically is low, such as by unassisted hand, i.e., without the aid of levers, machines, hydraulics, and the like. The preferred flexible substrate may be rolled upon itself.

Semiconductors

Useful materials for a semiconductor layer include organic semiconductors that include acenes, such as anthracene, tetracene, pentacene, and substituted pentacenes. Substituted pentacene compounds that are useful as organic semiconductors in the present invention include at least one substituent selected from the group consisting of electron-donating substituents (for example, alkyl, alkoxy, or thioalkoxy), halogen substituents, and combinations thereof. Useful substituted pentacenes include, but are not limited to, 2,9-dialkylpentacenes, 2,9-difluoropentacenes, and 2,10-dialkylpentacenes, wherein the alkyl group has from 1 to 12 carbons; 2,10-dialkoxypentacenes; and 1,4,8,11-tetraalkoxypentacenes. Such substituted pentacenes are taught in U.S. Pat. Nos. 6,974,877, and 6,864,396.

Examples of other useful semiconductors include perylenes, fullerenes, phthalocyanines, oligothiophenes, and substituted derivatives thereof. Particular organic semiconductor compounds include sexithiophene, α,ω-dihexylsexithiophene, quinquethiophene, quaterthiophene, α,ω-dihexylquaterthiophene, α,ω-dihexylquinquethiophene, poly (3-hexylthiophene), bis(dithienothiophene), poly(3-alkylthiophene), anthradithiophene, dihexylanthradithiophene, polyacetylene, poly(thienylenevinylene), poly(phenylene vinylene), $C_{60}$, copper(II) hexadecafluorophthalocyanine, and N,N'-bis(pentadecafluoroheptylmethyl)naphthalene-1,4,5,8-tetracarboxylic diimide.

The organic semiconductor layer can be provided by any useful means, such as for example, vapor deposition, solution deposition, spin coating, and printing techniques. The organic semiconductor layer can be patterned by deposition through an aperture mask. Useful aperture masks for this purpose are described in Applicants' Assignee's copending applications U.S. Published Appln No. 2006-0057857 and U.S. Pat. No. 6,897,164.

It is also within the scope of this invention to include inorganic semicondutors in the devices of this invention. Examples of such semiconductors include amorphous silicon and inorganic nanoparticle-based semiconductors such as cadmium sulfide or cadmium selenide.

Gate Electrode

The gate electrode can be any useful conductive material. For example, the gate electrode may include doped silicon, or a metal, such as aluminum, chromium, copper, gold, silver, nickel, palladium, platinum, tantalum, or titanium. Conductive polymers also can be used, for example polyaniline or poly(3,4-ethylenedioxythiophene)/poly(styrene sulfonate) (PEDOT:PSS). In addition, alloys, combinations, and multilayers of these materials may be useful.

Source and Drain Electrodes

The source electrode and drain electrode are separated from the gate electrode by the dielectric material of the present invention (e.g., a gate dielectric), while the organic semiconductor layer can be over or under the source electrode and drain electrode. The source and drain electrodes can be any useful conductive material. Useful materials include those described above for the gate electrode. For example, useful materials include aluminum, barium, calcium, chromium, copper, gold, silver, nickel, palladium, platinum, titanium, polyaniline, PEDOT:PSS, other conducting polymers, alloys thereof, combinations thereof, and multilayers thereof.

The thin film electrodes (e.g., gate electrode, source electrode, and drain electrode) can be provided by any useful means such as physical vapor deposition (e.g., thermal evaporation, sputtering), plating, or ink jet printing. The patterning of these electrodes can be accomplished by known methods such as shadow masking, etching, additive photolithography, subtractive photolithography, printing, microcontact printing, transfer printing, and pattern coating.

Objects and advantages of this invention are further illustrated by the following examples, but the particular materials and amounts thereof recited in these examples, as well as other conditions and details, should not be construed to unduly limit this invention.

EXAMPLES

All materials used in these examples are available from Aldrich Chemical (Milwaukee, Wis.) unless otherwise specified. All of the materials including solvents were used as received unless otherwise indicated.

Glass Transition Temperature

The glass transition temperature (Tg) was determined using a modulated DSC (Model Q1000, TA Instruments, New Castle, Del.). A linear heating rate of 5° C. per minute (min) was applied with a perturbation amplitude of ±0.796° C. every 60 seconds. The sample was subjected to a heat-quench-heat profile ranging from 15° C. to 265° C.

Molecular Weight and Molecular Weight Distribution

Molecular weights were determined by Gel Permeation Chromatography (GPC) using a Model 2695 Separation Module (available from Waters, Inc., Milford, Mass.) with a Model RID-10A Refractive Index Detector (available from Shimadzu N. A., Columbia, Md.) using polystyrene as an internal standard.

Fourier Transform Infrared Spectrometry

Infrared spectroscopy was performed on a NEXUS 670 Fourier Transform Infrared Spectrometer (available from Thermo-Nicolet, Madison, Wis.). The spectra were measured on films of polymer cast onto sodium chloride plates in the transmission mode.

Example 1

Synthesis of Polymer 1

A 250-millilter (mL), three-necked flask fitted with magnetic stirrer and nitrogen inlet was charged with 8.32 grams (g) 3-methyl aminopropionitrile (Aldrich) and a solution of 20.00 g styrene-maleic anydride copolymer (SMA 1000 resin available from Sartomer, Exton, Pa.) in 50 mL of anhydrous dimethylacrylamide (DMAc, Aldrich). After the mixture was stirred for 30 minutes (min) at room temperature, N,N-dimethylaminopyridine (DMAP) (0.18 g, 99%, Aldrich) was added and the solution was then heated at 110° C. for 17 hours (h). The solution was allowed to cool to room temperature and was slowly poured into 1.5 liters (L) of isopropanol while stirred mechanically. The yellow precipitate that formed was collected by filtration and dried at 80° C. for 48 h at reduced pressure (approximately 30 millimeters (mm) Hg). Yield: 26.0 g.

Twenty grams (20 g) of this material was dissolved in 50 mL anhydrous DMAc followed by the addition of 28.00 g glycidyl methacrylate (GMA) (Sartomer), 0.20 g hydroquinone (J. T. Baker, Phillipsburg, N.J.) and 0.5 g N,N-dimethylbenzylamine (Aldrich). The mixture was flashed with nitrogen and then was heated at 55° C. for 20 h. After the solution was allowed to cool to room temperature, it was poured slowly into 1.5 L of a mixture of hexane and isopropanol (2:1, volume:volume (v/v), GR, E.M. Science) with mechanical stirring. The precipitate that formed was dissolved in 50 mL acetone and precipitated twice, first into the same solvent mixture as used above and then using isopropanol. The solid was collected by filtration and was dried at 50° C. for 24 h under reduced pressure. (approximately 30 mm Hg). Yield: 22.30 g. FT-IR (film): 3433, 2249, 1723, 1637, 1458, 1290, 1160, and 704 $cm^{-1}$. Mn (number average molecular weight)=8000 grams per mole (g/mol), Mw (weight average molecular weight)=22,000 g/mol. Tg=105° C.

Example 2

Synthesis of Polymer 2

Using 25.00 g SMA 1000, 22.84 g 3,3'-iminodipropionitrile (Aldrich), and 28.00 g GMA, Polymer 2 was prepared using an identical procedure as used in Example 1 to yield 20.00 g light brown powder. FT-IR (film): 3457, 2247, 1700, 1632, 1494, 1454, 1292, and 1166 cm$^{-1}$. Mn=6500 g/mol, Mw=47,100 g/mol. Tg=117° C.

Example 3

Synthesis of a Graft Copolymer of bis(2-cyanoethyl)acrylamide and Polystyrene (Polymer 3)

A solution of 205 g bis(2-cyanoethyl)acrylamide (prepared according to the procedure of Schuller et al., *J. Org. Chem.*, 23, 1047 (1958)) and 2.06 g polystyrene-methacrylate macromer (made according to the procedure described in detail in the Example section of U.S. Pat. No. 4,554,324 (Husman) under the section "Monomer "C-4(a)") in 10.82 g methylethylketone was prepared. To this was added 0.02 g VAZO 67 (Dupont Chemicals, Delaware). The solution was sparged with nitrogen for 20 minutes, and heated overnight in a shaker bath at 70° C. The polymer was recovered by precipitation in excess methanol, followed by vacuum filtration and drying under vacuum overnight at room temperature. The resulting polymer had a weight average molecular weight (Mw) of 140,000 g/mol and a polydispersity of 5.5 based on GPC in tetrahydrofuran against polystyrene standards.

Example 4

Synthesis of poly(4-vinylbenzylcyanide) (Polymer 4)

A mixture of 22.2 g 4-vinyl benzylchloride (0.131 mol), 60 mL dimethylsulfoxide, and 12.8 g potassium cyanide (0.196 mol) was stirred at room temperature for 17 hours. The mixture was poured into 500 mL water and extracted several times with ethyl acetate. The combined organic layers were washed with brine and concentrated under vacuum. The crude red oil was purified by column chromatography on silica gel using 7/93 ethyl acetate/hexane to give 4-vinylbenzylcyanide, a yellow oil (18.03 g, 96%).

A solution was then prepared containing 4-vinylbenzylcyanide (1.0 g), cyclopentanone (18.0 g), and VAZO 67 (0.04 g). The solution was sparged with nitrogen gas for 10 minutes, then heated overnight on a shaker bath at 65° C. The polymer, poly(4-vinylbenzylcyanide), was recovered by precipitation into excess methanol, followed by vacuum filtration, and dried in a vacuum oven overnight at room temperature. It had a weight average molecular weight of 23,500 g/mol and a polydispersity of 2.75 based on GPC in THF against polystyrene standards.

Example 5

Synthesis of poly(4-(2,2'-dicyanopropyl)styrene) (Polymer 5)

The monomer, 4-(2,2'-dicyanopropyl)styrene, was prepared by a reaction series, as described below:

Synthesis of methyl malonamide. To a mixture of 200 mL methanol saturated with ammonia and 0.40 g sodium (17 mmol) cooled to 0° C. was added a solution of 32.15 g dimethyl methyl malonate (0.22 mol) in 100 mL methanol. The mixture was warmed to room temperature and left to stand for 3 days. The white solid that precipated was filtered, washed with methanol, and dried under vacuum (17.0 g, 67%).

Synthesis of monomethyl malonitrile. A mixture of 9.50 g methyl malonamide (82 mmol) and 62 g phosphorous pentoxide (0.22 mol) was heated to 200° C. under vacuum (2 mm Hg). The product distilled from the reaction mixture and was collected in a cold trap. The product is a low melting colorless solid (3.35 g, 51%).

Synthesis of 4-(2,2'-dicyanopropyl) styrene. A sample (2.53 g) of triethylamine (25 mmol) was added dropwise to a mixture of 4.01 g 4-vinylbenzyl chloride (25 mmol), 2.00 g monomethyl malonitrile (25 mmol), and 15 mL DMSO at room temperature. The mixture was stirred at room temperature for 17 hours then poured into 100 mL water. A pink solid precipitated and was filtered. The solid was recrystallized from a mixture of methanol and water to give 3.141 g (64%) of pinkish crystals.

Synthesis of poly(4-(2,2'-dicyanopropyl)styrene). A solution was then prepared containing 1.0 g 4-(2,2'-dicyanopropyl) styrene, 9.0 g cyclopentanone, and 0.0195 g VAZO 67. This solution was sparged with nitrogen gas for 10 minutes, then heated overnight in a shaker bath at 65° C. The polymer was recovered by precipitation into excess methanol, followed by vacuum filtration, and dried in a vacuum oven overnight at room temperature. It had a weight average molecular weight of 18,300 g/mol and a polydispersity of 2.58 based on GPC in THF against polystyrene standards.

Example 6

Synthesis of poly(4-(1,1',2-tricyanoethyl)styrene) (Polymer 6)

The monomer 4-(1,1',2-tricyanoethyl)styrene was prepared by a reaction series, as described below:

Synthesis of 4-vinyl benzaldehyde. To a mixture of 26.82 g p-terepthaldehyde (0.20 mol), 47.63 g methyltriphenyl phosphonium bromide (0.13 mol), and 300 mL dry tetrahydrofuran was added 130 mL of a 1 molar (M) solution of potassium t-butoxide in tetrahydrofuran (0.13 mol) over 1 hour. After stirring at room temperature for 17 hours, the solvent was removed under vacuum. The residue was mixed with 100 mL 50/50 ethylacetate/hexane and filtered. The filtrate was concentrated under vacuum and purified by column chromatography on silica gel using 5% ethyl acetate in hexane. The product was obtained as a yellow oil (11.51 g, 67%).

Synthesis of 4-(2,2'-dicyanoethenyl)styrene. To a mixture of 5.00 g 4-vinylbenzaldehyde (38 mmol), 2.50 g malonitrile (38 mmol), and 20 mL ethanol was added one drop of piperidine. After stirring for 2 hours, the solid that had precipitated was filtered and washed with ethanol. The yellow solid was then dried under vacuum (5.62 g, 83%).

Synthesis of 4-(1,2,2'-tricyanoethyl)styrene. To a mixture of 2.00 g 4-(2,2'-dicyanoethenyl)styrene (11 mmol) and 30 mL ethanol was added a solution of 1.45 g potassium cyanide (22 mmol) in 3 mL water. The mixture was stirred at room temperature for 17 hours. 1.8 mL concentrated HCl (22 mmol) was then added and the mixture was concentrated under vacuum. Ten milliliters (10 mL) water was added to the residue, and the mixture was extracted with ethyl acetate. The combined organic layers were concentrated under vacuum, and the product was purified by column chromatography on silica gel using 20% ethyl acetate in hexane. The product recovered from the separation was mixed with 1.5 mL methylene chloride and 10 mL hexane, then filtered. A white solid was obtained (1.009 g, 44%).

Synthesis of poly(4-(1,2,2'-tricyanoethyl)styrene). A solution was prepared containing 0.50 g 4-(1,2,2'-tricyanoethyl) styrene, 4.53 g cyclopentanone, and 0.01 g VAZO 67. This was sparged with nitrogen gas for 10 minutes, then heated overnight in a shaker bath at 65° C. The polymer was recovered by precipitation into excess hexanes, followed by vacuum filtration, and dried in a vacuum oven overnight at room temperature.

Example 7

Synthesis of poly(4-(bis-cyanoethyl)aminomethyl)styrene) (Polymer 7)

A mixture of 5.00 g 4-vinylbenzyl chloride (32.8 mmol), 8.97 g bis(cyanoethyl)amine (65.5 mmol), and 11 mL chloroform were heated to 65° C. for 8 hours. After cooling to room temperature, the mixture was diluted with 20 mL ethyl acetate then filtered. The filtrate was concentrated under vacuum, and the residue was purified by column chromatography over silica gel using a 1:1 mixture of ethyl acetate and hexane. The product was isolated as a viscous, yellow oil (4.10 g, 52% yield).

A sample (2.68 g) of this material was dissolved in 6.04 g methylethylketone, in the presence of 0.0149 g VAZO 52. The solution was sparged with nitrogen gas for 20 minutes, then sealed in a glass bottle. It was then heated for 36 h at 50° C. in a water bath with agitation. The solution was precipitated into approximately 100 mL of methanol. The polymer precipitate was recovered by decanting the supernatant and dried under vacuum overnight at approximately 50° C.

Example 8

Synthesis of poly(4-vinylbenzylcyanide-co-4-vinyl-benzylacrylate) (Polymer 8)

A solution was prepared containing 2.06 g 4-vinylbenzyl cyanide, 0.51 g 4-vinylbenzyl chloride, 10.04 g methylethylketone, and 0.0143 g VAZO 67. The solution was sparged with nitrogen gas for 20 min, then heated overnight at 65° C. on a shaker bath. The polymer was recovered by precipitation into excess methanol, followed by vacuum filtration and drying in a vacuum oven overnight at room temperature.

A sample (0.40 g) of this polymer was dissolved in 4.66 g dimethylformamide. To this solution was added 0.09 g acrylic acid, 0.01 g hydroquinone, and 0.20 g triethylamine. This solution was stirred overnight at room temperature. During this time, a precipitate formed. After filtration, the polymer was recovered by precipitation into water, followed by drying overnight in a vacuum oven at room temperature.

Dielectric Constant Measurement

Figure 4:
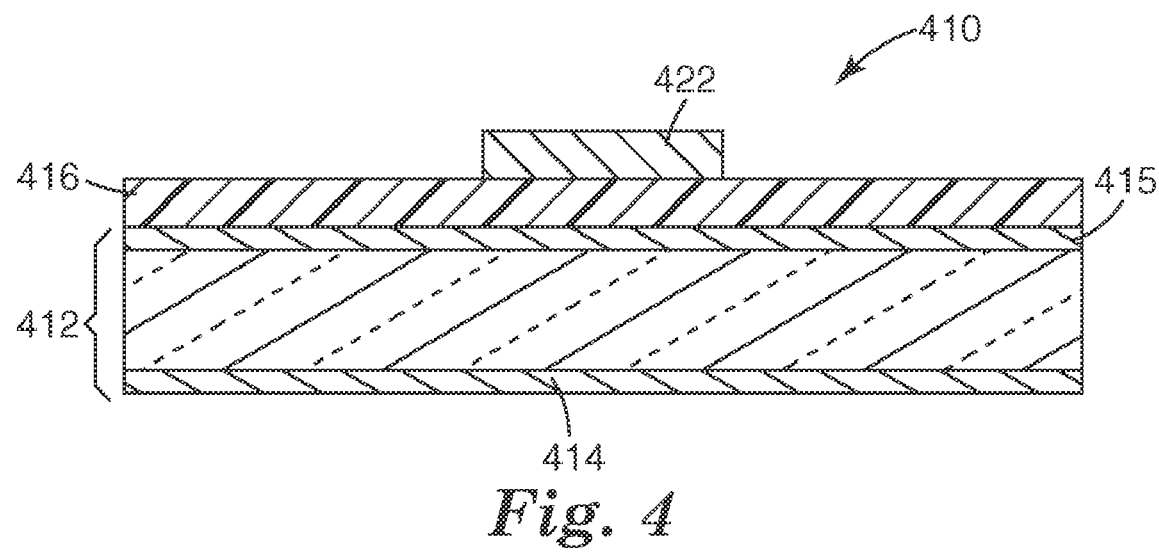
FIG. 4 is a schematic of a test structure (capacitor) with an unpatterned electrode, an unpatterned dielectric layer and a patterned electrode.

The dielectric constants of the polymeric dielectrics of the invention were determined by constructing a test device (capacitor) 410 as shown in FIG. 4. Heavily doped silicon wafers 412, <100> orientation, 5000 Angstroms (Å) Al on the backside 414, 5000 Å Ta on the front side 415, purchased from Silicon Valley Microelectronics, San Jose, Calif., were quartered and thin (less than 10000 Å) polymeric dielectric layers 416 were spin-coated on top of the Ta layers. Spin-coating solutions were prepared at a loading of 5-15% by weight of polymer, in either cyclopentanone or dimethylformamide, as indicated in Table 1. The solutions were spun for 20 seconds (sec) at 500 revolutions per minute (rpm), followed by 1000 rpm for 40 sec. The coated polymer was annealed at 140° C. for 35 minutes in an oven. One thousand angstroms (1000 Å) of Au 422 was thermally deposited at a pressure below $5 \times 10^{-6}$ torr and at a rate of 2.5 Å/sec. through a metal stencil mask (apertures were rectangular in shape and dimensions varied from 8-18 millimeters (mm)) on top of each polymeric dielectric sample. Serial capacitance measurements were obtained using an Agilent 4396B Network/Spectrum/Impedance Analyzer (available from Agilent, Palo Alto, Calif.) in impedance mode and a 43961A RF Impedance Test Adapter (Agilent). Before each set of measurements was obtained, the analyzer was calibrated using the 43961A Impedance Test Kit and a compensation routine was performed to account for internal capacitance of the analyzer and the test fixture. The compensation routine also allowed us to define the effective electrical length of the test fixture. The Al layer of each wafer was placed in contact with the ground plane of the test fixture and the probe of the test fixture was placed in contact wit the Au film. Capacitance was measured for each sample at a frequency of 100 killohertz (kHz), except where otherwise indicated. Measurements were made on three separate occasions and were averaged to give the final values presented in Table 1, below. The polymer layer thicknesses were measured using a Dektak 3030 profilometer (available from Veeco, Plainview, N.Y.), and these values were subsequently used to calculate dielectric constants. This calculation was based on the following equation: $\epsilon_r = C_s \cdot t / A \cdot \epsilon_o$ (all in SI units, Cs is measured serial capacitance, t is thickness of the dielectric layer, A is area of the Au contact, $\epsilon_o$ is permittivity of free space and was taken to be $8.85 \times 10^{-12}$ F/m$^2$). Results of these measurements are summarized in Table 1 below.

TABLE 1

Polymer Dielectric Constants

| Polymer | Solvent | Solution Conc. (wt-%) | Thickness (Å) | Dielectric Constant (100 kHz) |
|---|---|---|---|---|
| Polystyrene Control | | | | 2.49–2.55 (amorphous) 2.61 (crystalline)[a] |
| 1 (crosslinked) | Cyclopentanone | 12.8 | 5020 | 5.7 (1 MHz) |
| 2 (crosslinked) | Cyclopentanone | 12.8 | 9060 | 6.0 (1 MHz) |
| 3 | Dimethylformamide | 7.3 | 6530 | 4.6 |
| 4 | Cyclopentanone | 5.0 | 8520 | 7.0 |
| 5 | Cyclopentanone | 5.0 | 2540 | 4.9 |
| 6 | Dimethylformamide | 5.0 | 1260 | 3.9 |
| 7 | Cyclopentanone | 5.0 | 2340 | 5.9 |
| 8 | Dimethylformamide | 5.0 | 3750 | 5.6 |

[a] = literature value from J. Brandrup and E. H. Immergut, Polymer Handbook, 3rd Edition, V/81, Physical Constants of Polystyrene, John Wiley & Sons, NY, 1989.
Polymers 1 and 2 were crosslinked according to the procedure described in Example 9.

Device Mobility Measurements

Figure 5:
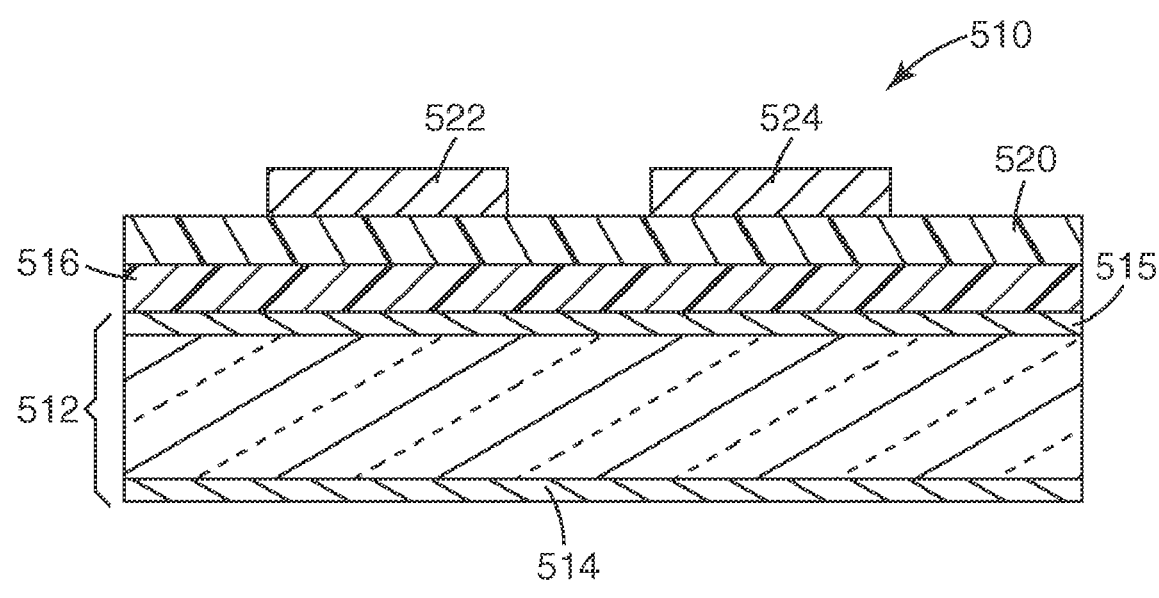
FIG. 5 is a schematic of a test structure for an organic thin film transistor with an unpatterned gate electrode, an unpatterned dielectric layer, an unpatterned semiconductor layer, and patterned source/drain electrodes.
Figure 6:
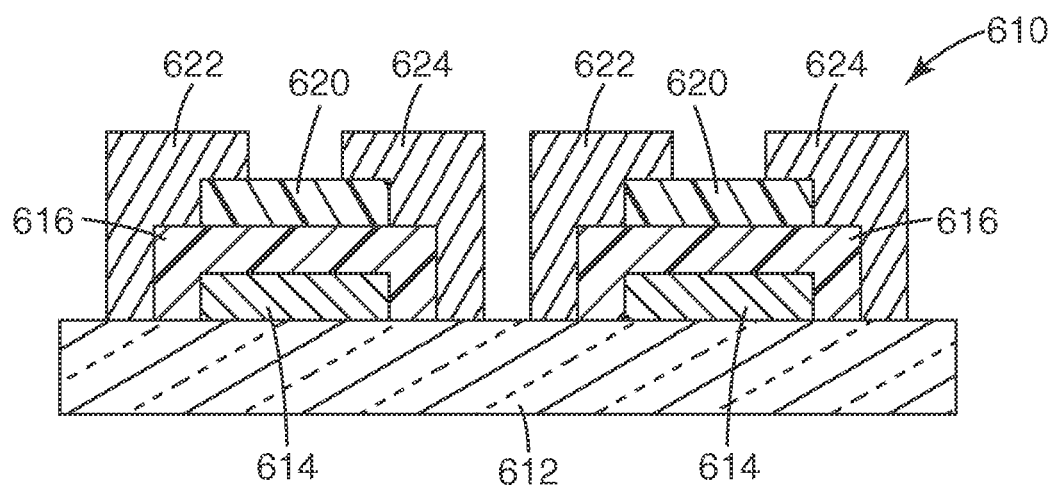
FIG. 6 is a schematic of an organic thin film transistor array with patterned gate electrodes, a patterned dielectric layer, a patterned semiconductor layer, and patterned source/drain electrodes.
Figure 7:
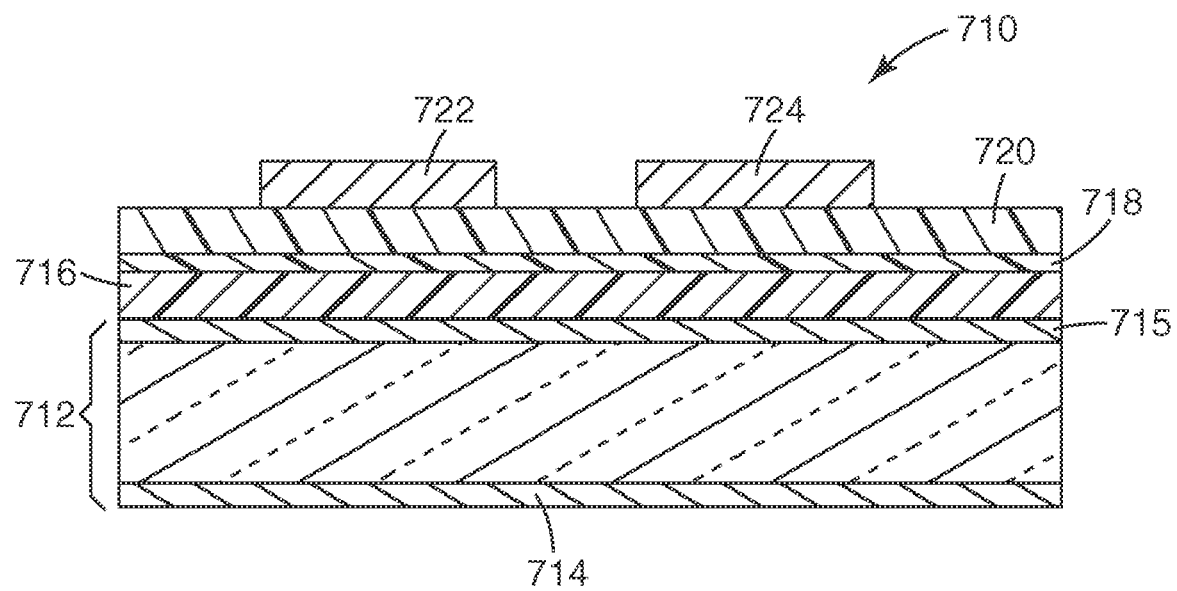
FIG. 7 is a schematic of test structure for an organic thin film transistor with an unpatterned gate electrode, an unpatterned dielectric layer, an unpatterned passivation layer, an unpatterned semiconductor layer, and patterned source/drain electrodes.

Dielectric films prepared in a fashion similar to that described above were used as the basis to fabricate and test organic transistor devices as described in U.S. Pat. No. 6,433,359 (Kelley). The device 510 fabricated as described is shown in FIG. 5. Heavily doped silicon wafers 512, <100> orientation, 5000 Å Al on the backside (gate electrode) 514, 5000 Å Ta on the front side 515, purchased from Silicon Valley Microelectronics, San Jose, Calif., were quartered and a film of high dielectric polymer 516 was deposited onto the front side of the wafer using a spin coating procedure identical to that described in the previous section on dielectric constant measurement above. The polymer was annealed at 140° C. for 35 minutes in an oven. 600 Å of pentacene 520 at a pressure of $2 \times 10^{-6}$ torr (as measured by quartz crystal microbalance) was deposited at a rate of approximately 0.1 Å/sec directly onto the front side of the substrates. Lastly, 600 Å of gold source pads 522 and drain pads 524 were deposited through a shadow mask onto the pentacene 520 at a rate of 2.5 Å/sec and at a pressure of $2\times10^{-6}$ torr. Transistor performance characteristics for each polymer that was measured are summarized below in Table 2.

TABLE 2

Characteristics of Thin Film Transistors Made with Organic Dielectric Layers

| Dielectric | Mobility $cm^2/V \cdot s$ | Vth | Subthreshold Slope V/decade | On/Off Ratio |
|---|---|---|---|---|
| $Al_2O_3$ Control | 0.87 | −10.2 | 1.17 | $5.3 \times 10^6$ |
| $SiO_2$ Control | 0.85 | −9.28 | 2.72 | $4.4 \times 10^6$ |
| 1 (crosslinked) | 0.26 | −20.71 | 1.62 | $2.6 \times 10^5$ |
| 2 (crosslinked) | 0.42 | −20.61 | 3.11 | $2.2 \times 10^5$ |
| 3 | 0.91 | −12.45 | 3.12 | $3.1 \times 10^5$ |
| 4 | 2.48 | −5.6 | 1.4 | $1.3 \times 10^5$ |
| 5 | 0.36 | −15.5 | 9.5 | $1.2 \times 10^2$ |
| 6 | 1.3 | −11.3 | 2.2 | $2.0 \times 10^5$ |
| 7 | 2.6 | −8.6 | 1.8 | $3.6 \times 10^4$ |

$Al_2O_3$ and $SiO_2$ Controls were fabricated as described in U.S. Pat. No. 6,433,359 (Kelley).

Example 9

Photopatterning of Organic Dielectric.

A photopatternable solution of Polymer 1 was made by dissolving 3.00 g of Polymer 1 (12.80 parts), 0.3 g pentaerythritol triacrylate (1.30 parts, Aldrich) and 0.17 g IRGACURE 819 photoinitiator (0.70 part, Ciba, Basel, Switzerland) in 20 g cyclopentanone (85.20 parts). The solution was kept in the dark and was filtered through a 0.45 micrometer (μm or micron) filter before use.

Enough of this solution to cover a silicon wafer mounted on a spin coater was transferred by pipette. The wafer was spun at 6000 rpm until dry to the touch. The coated wafer was baked at 80° C. for five minutes on a hot plate to remove residual solvent. A silicon shadow mask with rectangular bars cut into it with the dimensions of 1 millimeter (mm)×0.2 mm with spacings between the bars of 40 μm was clamped on top of the substrate. The substrate was exposed to UV light in a nitrogen environment to crosslink the polymer in the exposed regions. The dose was in the C-band of the ultraviolet spectrum at an energy of 300 millijoules per square centimeter ($mJ/cm^2$).

The shadow mask was removed and the substrate was subjected to a post-exposure bake (5 seconds at about 150° C. on a hot plate) to enhance the sensitivity of the system. The unexposed photopolymer was removed by developing the wafer for less than 20 seconds in tetrahydrofuran. Finally, to complete the crosslinking, the remaining photopatterned polymer was post-baked at 165° C. for about 2 minutes. The result was a silicon wafer with rectangular bars of photopatterned dielectric crosslinked polymer matching the void spaces in the shadow mask.

Example 10

High Frequency Stability of Photopatternable Dielectric Layer

A photopatternable solution of Polymer 1 prepared according to the procedure described in Example 2 was spin-coated onto 35 μm thick copper foil (surface was treated with oxygen plasma) at 500 rpm for 40 seconds. After the sample was soft-baked at 80° C. for 4 minutes, it was exposed to UV light with an energy of 550 $mJ/cm^2$ in the C-band of the ultraviolet spectrum followed by post-baking at 110° C. for 2 minutes. The response of capacitance and dissipation loss of the sample at high frequency ranges were recorded on an Agilent 4396B Network/Spectrum/Impedence Analyzer (available from Agilent, Palo Alto, Calif.) in impedance mode coupled with a 43961A RF Impedance Test Adapter (Agilent). The results are summarized in Table 3.

TABLE 3

High Frequency Response of Polymer 1

| | 100 kHz | 1 MHz | 10 MHz | 100 MHz |
|---|---|---|---|---|
| Capacitance (nF) | 12.0 | 11.7 | 11.5 | 11.2 |
| Dissipation Loss (tan δ) | 0.025 | 0.014 | 0.014 | 0.012 |

Example 11

Construction of Patterned Transistors with Photopatternable Dielectric Layers

An array of patterned transistors 610 (FIG. 4) was made on a glass substrate as follows. A patterned gate layer 614 of 15 Å titanium and 600 Å gold was deposited onto a clean glass slide 612 through a silicon (Si) shadow mask. Then a solution of Polymer 1 prepared as described in Example 9 above was spin-coated onto the glass substrate and the photopolymer layer was exposed to UV radiation through an appropriate silicon shadow mask to form a patterned dielectric layer 616. After removing the uncrosslinked dielectric polymer layer and post-baking as described in Example 9, the transistors 610 were finished with 600 Å patterned vapor-deposited pentacene 620 followed by 600 Å of gold source 622 and drain 624 electrodes as shown. All layers were well aligned and the devices were tested as described above.

An array of transistors with vapor-deposited alumina was prepared in the same manner as above with the exception that the alumina was deposited by electron beam evaporation through a silicon shadow mask and was surface treated with poly(α-methylstyrene) as described in U.S. Pat. No. 6,946,676. Following surface treatment, pentacene was vapor deposited through a silicon shadow mask to a final thickness of 600 Å and transistors were finished by thermally evaporating 600 Å of gold through a silicon shadow mask.

The one of the formed thin film transistors from each group was tested as described earlier and the results are shown in Table 4.

TABLE 4

Characteristics of Organic Thin Film Transistors with Patterned Organic Dielectric Layers

| Dielectric | Mobility ($cm^2/V \cdot sec$) | Vth | Subthreshold Slope | On/Off Ratio |
|---|---|---|---|---|
| Surface-treated $Al_2O_3$ | 0.71 | −8.25 | 1.41 | $3.3 \times 10^6$ |
| Polymer 1 | 0.22 | −12.12 | 1.57 | $1.6 \times 10^7$ |

Example 12

Effect of Surface Treatment of Dielectric on Mobility

A series of test structures were prepared 710 (FIG. 5) with a layer of poly(α-methylstyrene) 718 situated between the dielectric layer 716 and the pentacene semiconductor layer 720. The devices were fabricated as follows:

Heavily doped silicon wafers 712, <100> orientation, 5000 Å Al on the backside (gate electrode) 714, 5000 Å Ta on the front side 715, purchased from Silicon Valley Microelectronics, San Jose, Calif., were quartered and a photopatternable film 716 of Polymer 1 using the formulation described in Example 9 was spin-coated onto the substrates. The polymer dielectric layer 716 was crosslinked by blanket exposure to UV light under a nitrogen atmosphere as previously described. For a control, an $Al_2O_3$-coated silicon wafer was obtained from Silicon Valley Microelectronics.

Surface treatments of 0.1% poly(α-methylstyrene) 718 in toluene, xylene, or cyclohexane were placed on the dielectric 716. The surface treatment layer 718 was applied using a spin-coater spinning at 500 rpm for 20 seconds followed by 2,000 rpm for 40 seconds. The coated samples were then placed in an oven at 120° C. for about 30 minutes. Then 600 Å of pentacene 720 was deposited on the treated surface at a rate of 0.2 Å/sec. Finally 600 Å gold source and drain pads (722 and 724) were deposited through a shadow mask onto the pentacene. The devices were tested and the results are displayed below in Table 5.

TABLE 5

Polymeric Thin Film Transistors Made with Surface Treatment

| Dielectric | Solvent Used for Surface Treatment poly(α-methylstyrene) | Mobility ($cm^2$/ V·sec) | Vth | Sub-threshold Slope | On/Off Ratio |
|---|---|---|---|---|---|
| $Al_2O_3$ | No treatment | 1.013 | −7.88 | 1.10 | $2.6 \times 10^6$ |
| Polymer 1 | No treatment | .5606 | −14.42 | 2.38 | $4.9 \times 10^5$ |
| $Al_2O_3$ | Toluene | 3.233 | 2.33 | 1.63 | $2.8 \times 10^5$ |
| Polymer 1 | Toluene | 1.663 | −16.28 | 1.90 | $1.9 \times 10^6$ |
| $Al_2O_3$ | Xylene | 1.681 | −.084 | 1.02 | $3.3 \times 10^5$ |
| Polymer 1 | Xylene | .7733 | −19.6 | 2.40 | $1.2 \times 10^6$ |
| $Al_2O_3$ | Cyclohexane | .8834 | −4.04 | 0.94 | $9.3 \times 10^5$ |
| Polymer 1 | Cyclohexane | .3399 | −14.92 | 1.87 | $4.9 \times 10^5$ |

Example 13

Preparation of Polymer/Ceramic Dielectric Materials

A solution was prepared by mixing the following components: 2.00 g of Polymer 1 or 2, 20.0 g cyclopentanone, and 0.20 g pentaerythritol triacrylate (Aldrich). This mixture was filtered through a 0.45 μm filtration cartridge. To 2.0 g of this filtered solution was added 1.0 g dispersion of barium titanate dispered in methyl ethyl ketone/methylisobutyl ketone (2:3 v/v, 60 weight percent (wt-%) of solid content). The final mixture has 37% volume loading of $BaTiO_3$ with respect to polymer. This mixture was ultrasonically stirred before use.

The same procedures were followed in preparing additional dispersion with different volume loadings of $BaTiO_3$.

Capacitance testing was performed as described above for the other polymer systems. The results are displayed below in Table 6.

TABLE 6

Dielectric Constant of Polymers 1 and 2 with Barium Titanate

| Sample Composition | Dielectric Constant (1 MHz) |
|---|---|
| Polymer 1 + $BaTiO_3$ (55% by vol) | 33.3 |
| Polymer 2 + $BaTiO_3$ (55% by vol) | 40.0 |
| Polymer 2 + $BaTiO_3$ (37% by vol) | 25.6 |

All patents, patent applications, and publications cited herein are incorporated by reference in their entirety as if individually incorporated. Various modifications and alterations of this invention will be apparent to those skilled in the art in view of the foregoing description, without departing from the scope and principles of this invention. Accordingly, it should be understood that this invention is not to be unduly limited to the illustrative embodiments set forth hereinabove.

What is claimed is:

1. A method of making an electronic device, the method comprising forming an organic polymer dielectric layer comprising a substantially nonfluorinated organic polymer having repeat units of the formulas:

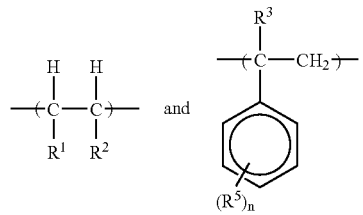

wherein:
each $R^1$ is independently H, Cl, Br, I, an aryl group, or an organic group that includes a crosslinkable group;
each $R^2$ is independently H, an aryl group, or $R^4$;
each $R^3$ is independently H or methyl;
each $R^5$ is independently an alkyl group, a halogen, or $R^4$;
each $R^4$ is independently an organic group comprising at least one CN group and having a molecular weight of about 30 to about 200 per CN group; and
n=0-3;
with the proviso that at least one repeat unit in the polymer includes an $R^4$.

2. The method of claim 1 wherein forming an organic polymer dielectric layer comprises forming a film of the nonfluorinated organic polymer and annealing the nonfluorinated organic polymer.

3. The method of claim 1 wherein forming an organic polymer dielectric layer comprises forming a film of the nonfluorinated organic polymer and crosslinking the nonfluorinated organic polymer.

4. The method of claim 1 wherein each $R^1$ is independently H, a (C5-C8)aryl group, Cl, Br, I, or an organic group that includes (meth)acrylate, amine, hydroxyl, thiol, oxirane, aziridine, chlorosilane, vinyl, or alkoxysilane groups.

5. The method of claim 1 wherein each $R^2$ is independently H, a (C5-C8)aryl group, or $R^4$ and each $R^4$ is a (C2-C20) organic group comprising at least one CN group and having a molecular weight of about 30 to about 200 per CN group.

6. The method of claim 1 wherein $R^4$ is N-methyl-(2-cyanoethyl)carbamido, N-bis(2-cyanoethyl)carbamido, p-(2-cyanoethyl)phenyl, p-(2,2-dicyanopropyl)phenyl, p-(1,2-dicyanopropionitrilo)phenyl, N-methyl-N-(2-cyanoethyl)

benzylamino, bis-N-(2-cyanoethyl)benzylamino, cyanomethyl, 2,2'-dicyanopropyl, 1,2,2'-tricyanoethyl, or N,N'-bis(2-cyanoethyl)aminoethyl.

7. The method of claim 1 wherein at least one $R^1$ includes a crosslinkable group.

8. The method of claim 7 wherein the crosslinkable group comprises (meth)acrylate, amine, hydroxyl, thiol, oxirane, aziridine, chlorosilane, vinyl, or alkoxysilane groups.

9. The method of claim 1 the device further comprises a polymeric surface-modifying film on at least a portion of the dielectric layer.

10. The method of claim 9 further comprising a semiconductor layer, wherein the polymeric surface-modifying film is interposed between the dielectric layer and the semiconductor layer.

11. The method of claim 9 wherein the polymeric surface-modifying film comprises a polymer having styrenic interpolymerized units.

12. The method of claim 9 wherein the polymeric surface-modifying film comprises a homopolymer of styrene.

13. The method of claim 1 wherein said organic polymer dielectric layer comprises a polymer comprising repeat units of the formulas:

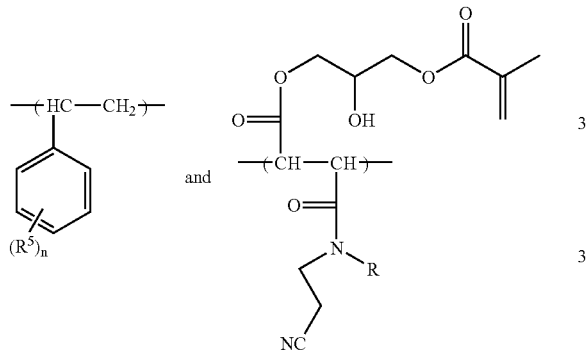

wherein:
R is $CH_3$ or $CH_2CH_2CN$;
each $R^5$ is independently an alkyl group, a halogen, or an organic group comprising at least one CN group and having a molecular weight of about 30 to about 200 per CN group; and
n=0-3.

14. The method of claim 1 wherein said organic polymer dielectric layer comprises a copolymer of bis(2-cyanoethyl)acrylamide with a polystyrene macromer.

15. The method of claim 1 wherein said organic polymer dielectric layer comprises a polymer comprising repeat units of the formula:

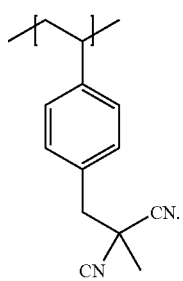

16. The method of claim 1 wherein said organic polymer dielectric layer comprises repeat units of the formula:

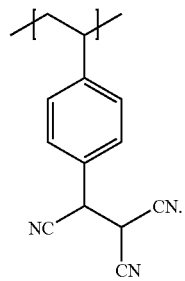

17. The method of claim 1 wherein said organic polymer dielectric layer comprises a polymer comprising repeat units of the formula:

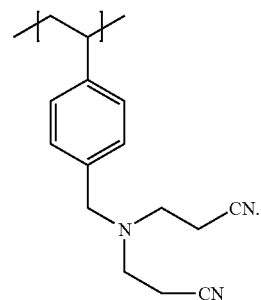

18. The method of claim 1 wherein said organic polymer dielectric layer comprises a copolymer comprising repeat units of the formula:

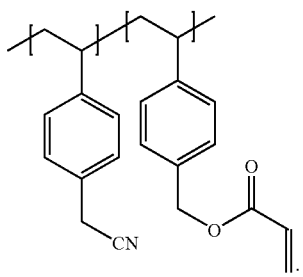

19. An electronic device prepared by the method of claim 1.

20. The device of claim 19 which is a capacitor, a thin film transistor, or an electroluminescent lamp.

21. The method of claim 1 wherein said step of forming is selected from knife coating, spin coating, drop coating, ink jetting, rotogravure coating, spray coating, and roll coating.

22. The method of claim 1 wherein said organic polymer dielectric layer further comprises fillers with high dielectric constants.

* * * * *

UNITED STATES PATENT AND TRADEMARK OFFICE
CERTIFICATE OF CORRECTION

PATENT NO.         : 7,473,652 B2
APPLICATION NO. : 11/428084
DATED                  : January 6, 2009
INVENTOR(S)        : Feng Bai It is certified that error appears in the above-identified patent and that said Letters Patent is hereby corrected as shown below:

On the Title page, item [56]:
Page 2,
Under "Other Publications," line 8, delete "11—" and insert -- II— --.
Under "Other Publications," line 11, delete "(1996)." and insert -- (1966). --.
Under "Other Publications," line 48, delete "Embedding" and insert
  -- Embedded --.
Under "Other Publications," line 55, delete "acrylamid"" and insert
-- acrylamide" --.

Column 8,
Lines 46-47, delete "deterioriating" and insert -- deteriorating --.

Column 15,
Line 12, delete "semicondutors" and insert -- semiconductors --.

Column 16,
Line 25, delete "anydride" and insert -- anhydride --.

Column 17,
Line 62, delete "precipated" and insert -- precipitated --.

Column 21,
Line 34, delete "photoinitator" and insert -- photoinitiator --.

Column 23,
Line 58, delete "dispered" and insert -- dispersed --.

UNITED STATES PATENT AND TRADEMARK OFFICE
CERTIFICATE OF CORRECTION

PATENT NO. : 7,473,652 B2
APPLICATION NO. : 11/428084
DATED : January 6, 2009
INVENTOR(S) : Feng Bai It is certified that error appears in the above-identified patent and that said Letters Patent is hereby corrected as shown below:

<u>Column 26,</u>
Line 59, delete "wherein" and insert -- where --.
Line 60, before "ink" insert -- dip coating, --.

Signed and Sealed this

Fourteenth Day of April, 2009

JOHN DOLL
*Acting Director of the United States Patent and Trademark Office*